United States Patent [19]
Dedic

[11] Patent Number: 6,100,830
[45] Date of Patent: Aug. 8, 2000

[54] DIFFERENTIAL SWITCHING CIRCUITRY

[75] Inventor: Ian Juso Dedic, Northolt, United Kingdom

[73] Assignee: Fujitsu Microelectronics Europe GmbH, Dreieich-Buchschlag, Germany

[21] Appl. No.: 09/227,202

[22] Filed: Jan. 8, 1999

[30]     Foreign Application Priority Data

Jan. 8, 1998 [GB]  United Kingdom ................... 9800387

[51] Int. Cl.$^7$ ..................................................... H03M 1/00
[52] U.S. Cl. .......................... 341/136; 341/136; 341/144; 341/154; 341/155; 341/118
[58] Field of Search ..................................... 341/144, 154, 341/155, 118, 136

[56]                  References Cited

U.S. PATENT DOCUMENTS

| | | |
|---|---|---|
| 4,961,015 | 10/1990 | Shin et al. . |
| 5,194,866 | 3/1993 | Imaizumi ................................. 341/156 |
| 5,369,402 | 11/1994 | Kwon . |
| 5,452,014 | 9/1995 | Manley . |
| 5,612,697 | 3/1997 | Mercer ..................................... 341/153 |
| 5,689,257 | 11/1997 | Mercer et al. . |
| 5,696,512 | 12/1997 | Takiguchi ................................. 341/144 |

OTHER PUBLICATIONS

Horowitz, Paul & Hill, Winfield, "The Art of Electronics", 2nd Edition, Cambridge University Press, 1989, Chapter 3, Field–Effect Transistors, pp 128.129, and Chapter 9, Digital Meets Analog, pp 614–620.
Analog Devices, 1996, Product Information AD9762, 12–bit, 100MsPs +TxDAC D/A Converter.
RAZAVI, Behzad, "Principles of Data Conversion System Design." pp 90–94.

U.S. application No. 09/227,254, Dedic et al., filed Jan. 8, 1999, Electrostatic Discharge Protection in Semiconductor Devices Fujitsu Limited.
U.S. Ser. No. 09/227,201, Dedic et al., filed Jan. 8, 1999, Mixed–Signal Circuitry and Intergrated Circuit Devices Fujitsu Limited.
U.S. Ser. No. 09/227,200, Schofield et al., filed Jan. 8, 1999, Thermometer Coding Circuitry Fujitsu Microelectronics Limited.

*Primary Examiner*—Brian Young
*Assistant Examiner*—Jason Kost
*Attorney, Agent, or Firm*—Staas & Halsey LLP

[57]                   ABSTRACT

Differential switching circuitry, for use for example in a digital-to-analog converter, includes: a first switch element (S1) connected between a common node (CN) and a first output node (OUT1), and a second switch element (S2) connected between the common node (N) and a second output node (OUT2). First and second driver circuits (12, 14) correspond respectively to the first and second switch elements, each driver circuit switching its corresponding element ON and OFF in dependence upon an applied input signal (IN1, IN2). The driver circuits co-operate such that one switch element is ON when the other is OFF. Each switch element (S1, S2) is paired with a matching element (46, 44) in the other switch element's driver circuit. That matching element (e.g. 44) is coupled operatively to its paired switch element's driver circuit (14) and is matched, e.g. in gate-source potential, with its paired switch element (S2) such that switching of the matching element from OFF to ON is matched with switching of its paired switch element (S2) from OFF to ON, that switching of the matching element serving to bring about switching of said other switch element (S1) from ON to OFF. In such differential switching circuitry, symmetrical switching of the switch elements is ensured even if the input signals do not undergo symmetrical changes.

40 Claims, 9 Drawing Sheets

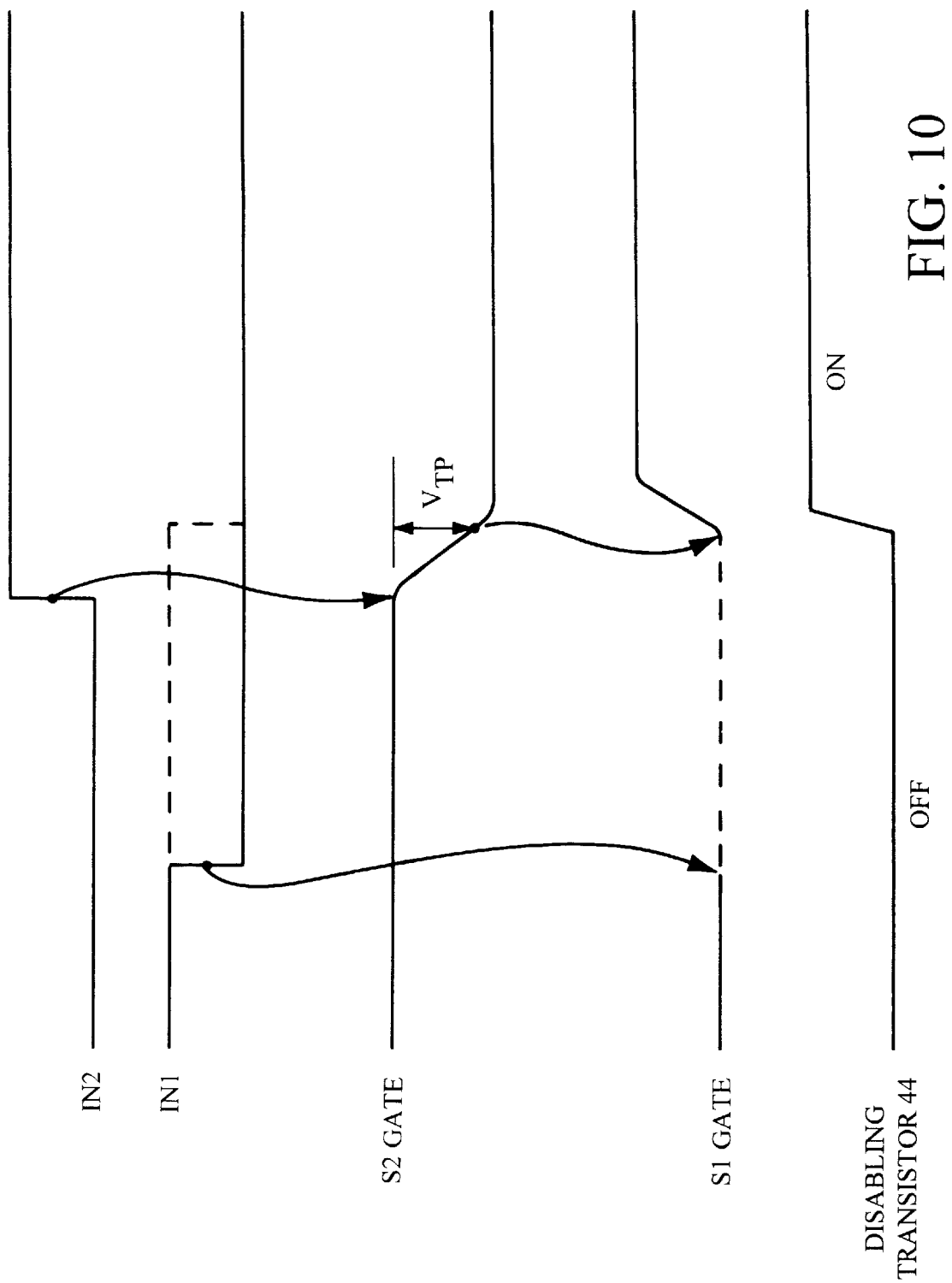

DIFFERENTIAL SWITCHING CIRCUITRY

CROSS REFERENCE TO RELATED APPLICATIONS

The subject application is related to the following U.S. and respective foreign priority applications:

MIXED-SIGNAL CIRCUITRY AND INTEGRATED CIRCUIT DEVICES filed concurrently and claiming priority from Great Britain application No. 9804587.5 filed Mar. 4, 1998 assigned to Fujitsu Limited;

THERMOMETER CODING CIRCUITRY filed concurrently and claiming priority from Great Britain application No. 9800384.1 filed Jan. 8, 1998 assigned to Fujitsu Microelectronics Limited;

ELECTROSTATIC DISCHARGE PROTECTION IN SEMICONDUCTOR DEVICES filed concurrently and claiming priority from Great Britain application No. 9804588.3 filed Mar. 4, 1998 assigned to Fujitsu Limited; and CELL ARRAY CIRCUITRY, U.S. Ser. No. 09/137,837 filed Aug. 21, 1998 and claiming priority from Great Britain application No. 9800367.6 filed Jan. 8, 1998 assigned to Fujitsu Limited.

BACKGROUND OF THE INVENTION

1. Field of the Invention

The present invention relates to differential switching circuitry for use, for example, in digital-to-analog converters.

2. Description of the Prior Art

FIG. 1 of the accompanying drawings shows parts of a previously-considered current-switched digital-to-analog converter (DAC) 1. The DAC 1 is designed to convert an n-bit digital input word into a corresponding analog output signal.

The DAC 1 includes a plurality of individual binary-weighted current sources $2_1$ to $2_n$ corresponding respectively to the n bits of the digital input word applied to the DAC. Each current source passes a substantially constant current, the current values passed by the different current sources being binary-weighted such that the current source $2_1$ corresponding to a least-significant-bit of the digital input word passes a current I, the current source $2_2$ corresponding to the next-least-significant-bit of the digital input word passes a current 2I, and so on for each successive current source of the converter.

The DAC 1 further includes a plurality of differential switching circuits $4_1$ to $4_n$ corresponding respectively to the n current sources $2_1$ to $2_n$. Each differential switching circuit 4 is connected to its corresponding current source 2 and switches the current produced by the current source either to a first terminal connected to a first connection line A of the converter or a second terminal connected to a second connection line B of the converter. The differential switching circuit receives one bit of the digital input word (for example the differential switching circuit $4_1$ receives the least-significant-bit of the input word) and selects either its first terminal or its second terminal in accordance with the value of the bit concerned. A first output current $I_A$ of the DAC is the sum of the respective currents delivered to the differential-switching-circuit first terminals, and a second output current $I_B$ of the DAC is the sum of the respective currents delivered to the differential-switching-circuit second terminals. The analog output signal is the voltage difference $V_A - V_B$ between a voltage $V_A$ produced by sinking the first output current $I_A$ of the DAC 1 into a resistance R and a voltage $V_B$ produced by sinking the second output current $I_B$ of the converter into another resistance R.

FIG. 2 shows a previously-considered form of differential switching circuit suitable for use in a digital-to-analog-converter such as the FIG. 1 converter.

This differential switching circuit 4 comprises first and second PMOS field effect transistors (FETS) S1 and S2. The respective sources of the transistors S1 and S2 are connected to a common node $I_{IN}$ to which a corresponding current source ($2_1$ to $2_n$ in FIG. 1) is connected. The respective drains of the transistors S1 and S2 are connected to respective first and second output nodes $I_{OUTA}$ and $I_{OUTB}$ of the circuit which correspond respectively to the first and second terminals of each of the FIG. 1 differential switching circuits.

Each transistor S1 and S2 has a corresponding driver circuit $6_1$ or $6_2$ connected to its gate. Complementary input signals IN1 and IN2 are applied respectively to the inputs of the driver circuits $6_1$ and $6_2$. Each driver circuit buffers and inverts its received input signal IN1 or IN2 to produce a switching signal SW1 or SW2 for its associated transistor S1 or S2 such that, in the steady-state condition, one of the transistors S1 and S2 is on and the other is off. For example, as indicated in FIG. 2 itself, when the input signal IN1 has the high level (H) and the input signal IN2 has the low level (L), the switching signal SW1 (gate drive voltage) for the transistor S1 is at the low level L, causing that transistor to be ON, whereas the switching signal SW2 (gate drive voltage) for the transistor S2 is at the high level H, causing that transistor to be OFF. Thus, in this condition, all of the input current flowing into the common node $I_{IN}$ is passed to the output node $I_{OUTA}$ and no current passes to the output node $I_{OUTB}$.

When it is desired to change the state of the circuit 4 of FIG. 2 so that the transistor S1 is OFF and the transistor S2 is ON, complementary changes are made simultaneously in the input signals IN1 and IN2 such that the input signal IN1 changes from H to L at the same time as the input signal IN2 changes from L to H. As a result of these complementary changes, it is expected that the transistors S1 and S2 will switch symmetrically, that is that the transistor S1 will turn OFF at exactly the same moment that the transistor S2 turns ON. However, in practice there is inevitably some asymmetry in the turn-ON and turn-OFF speeds. This can result in a momentary glitch at the common node $I_{IN}$ which may in turn cause glitches at one or both output nodes of the circuit, producing a momentary error in the DAC analog output value until all of the switches have switched completely. These glitches in the analog output signal may be code-dependent and result in harmonic distortion or even non-harmonic spurs in the output spectrum.

As the size of the glitch associated with the switching of the differential switching circuit is dependent on the symmetry of the complementary changes in the input signals IN1 and IN2, much attention has been directed to generating and delivering these input signals to the differential switching circuit synchronously with one another. However, it is found in practice that, even if the input signals are perfectly symmetrical, the drive circuits $6_1$ and $6_2$ which derive the switching signals from the input signals inevitably introduce asymmetry into the switching signals SW1 and SW2 which actually control the transistors S1 and S2. Such asymmetry results in transient output current distortion in any individual differential switch circuit. Furthermore, in a DAC employing multiple differential switch circuits, it also results in a variation between the switching times of the different circuits. These variations lower the spurious-free dynamic range (SFDR) of the DAC (a measure of the difference, in dB, between the rms amplitude of the output signal and the peak spurious signal over the specified bandwidth). These variations also lead to code-dependency of the analog output signal of the converter.

BRIEF SUMMARY OF THE INVENTION

According to a first aspect of the present invention there is provided differential switching circuitry including: a first switch element connected between a common node of the circuitry and a first output node of the circuitry; a second switch element connected between the said common node and a second output node of the circuitry; first and second driver means corresponding respectively to the said first and second switch elements, each having an input for receiving an input signal and an output connected to a control terminal of its corresponding switch element for applying thereto a switching signal so as to switch the element ON or OFF, each driver means being switchable, by application thereto of a disabling signal, from a responsive state in which it is operable to change its said switching signal in response to an input-signal change at its said input, to a non-responsive state in which the said switching signal is not changed in response to such an input-signal change, the said input signals received respectively at the first-driver-means input and the said second-driver-means input being mutually complementary; and cross-coupling means connected for deriving the said disabling signal for each of the first and second driver means from the said input signal of the other driver means such that when the respective input signals undergo complementary changes one of the said driver means is initially in the said responsive state and the other of the said driver means is initially in the said non-responsive state.

In such differential switching circuitry, symmetrical switching of the switch elements is ensured even if the input signals do not undergo symmetrical changes.

The initially-non-responsive driver means is preferably the driver means whose corresponding switch element is ON when the said respective input signals undergo complementary changes.

Each driver means inevitably generate internally various signals, including the switching signal itself, that are derived from the input signal. It is possible to take advantage of the availability of such signals to reduce the number of components of the circuitry.

For example, the said disabling signal for each of the first and second driver means may be derived from, or even be one and the same signal as, the said switching signal produced by the other driver means.

The type of switch element is not critical. For example, bipolar or FET transistors of either conductivity type can be used (npn or pnp bipolar, nor p-type FET).

When each said switch element is a p-type conductivity transistor, it is preferable that the said switching signal applied by each driver means to its said corresponding switch element is the logical NOR of its said input signal and its said disabling signal. When each said switch element is an n-type conductivity transistor, on the other hand, it is preferable that the said switching signal applied by each driver means to its said corresponding switch element is the logical NAND of its said input signal and its said disabling signal. These NOR and NAND functions are simple and convenient to realise using low numbers of either bipolar or FET transistors.

Preferably, each driver means includes a disabling transistor, of the same conductivity type as the said switch-element transistors, which, when turned ON, serves to bring the switching-signal potential to an OFF potential at which the said corresponding switch element of that driver means is turned OFF.

When the switch elements are FETs, it is preferable that in each driver means the gate potential of the said disabling transistor matches (is the same or has only a small-variation offset from) the gate potential of the said field-effect transistor of the said corresponding switch element of the other driver means. For example, the gate of the disabling transistor and the gate of the switch element FET may be connected together.

Alternatively, or in addition, it is preferable that in each driver means the source potential of the said disabling transistor matches (is the same or has only a small-variation offset from) the source potential of the said field-effect transistor of the said corresponding switch element of the other driver means. For example, in each driver means the source of the said disabling transistor may be connected to the said common node.

These measures ensure that the disabling transistor and switch element concerned switch together.

In a preferred embodiment, each said driver means includes: first and second supply lines; a first circuit selectively activatable to pull the potential of the said output towards the first-supply-line potential so as to turn the said corresponding switch element ON; and a second circuit selectively activatable to pull the output potential towards the second-supply-line potential so as to turn the said corresponding switch element OFF.

Such driver means has a desirably simple construction.

Preferably, operation of the said second circuit is disabled by the said disabling signal, making the operation of the driver means simple and convenient to control.

The said first circuit preferably includes current control means for controlling the rate at which the output potential is pulled towards the first-supply-line potential when the first circuit is activated. This helps to prevent glitches in the output-node potentials when the first circuit is activated.

It is undesirable for the first and second circuits to both be deactivated at the same time since this leaves the switching signal in a floating condition in which it can be affected by noise. Preferably, therefore, each said driver means further includes open-circuit avoidance means for maintaining the output potential at a predetermined ON potential, such as to maintain the said corresponding switch element in an ON condition, when neither the said first nor the said second circuit of the driver means concerned is activated.

The second-supply-line potential may be a fixed potential such as Vdd (or Vss depending on the design). Preferably, however, the said second-supply-line potential is equal to or close to the potential of the said common node. This can enable the circuit elements of the second circuit to receive the same potentials as the switch element it controls, even though the common-node potential is usually a floating potential, ensuring the co-ordination in switching speeds between the second circuit and its switch element irrespective of variations in the common-node potential.

Preferably, the circuitry further comprises respective first and second rate control means for generating the said first and second mutually-complementary input signals respectively, each said rate control means serving to control a slew rate of the input signal it generates. This is effective in preventing glitches and other undesirable effects associated with complementary changes in the input signals that are unduly fast.

Preferably the said first and second rate control means serve to equalise the respective slew rates of the first and second input signals. This is effective in preventing glitches and other undesirable effects associated with complementary changes in the input signals that are of different rates.

Preferably the circuitry further comprises compensation means connected to each said switch element for compensating for charge coupled from the initially-non-responsive driver means to its said corresponding switch element when the input signal of that driver means changes. Such undesirable coupling may occur due to parasitic capacitances of transistors in the driver means, particularly the second-circuit transistors.

Such compensation is advantageously effected by cross-coupling a countercharge to the said switch element corresponding to the initially-non-responsive driver means when the input signal of the initially-responsive driver means changes. This is convenient because in the initially-responsive driver means there is inevitably at least one signal that undergoes a change complementary to the change in the switching-signal potential that occurs in the initially-non-responsive driver means due to the undesirable charge coupling.

For example, the said compensation means may comprise, for each said driver means, a capacitor that is operatively coupled between the said output of the driver means concerned and the said input of the other driver means. This makes the compensation process simple but effective, especially since the capacitors can be formed from FETs or the like that are matched in size and/or conductivity type with the switch-element FETs.

According to a second aspect of the present invention there is provided claim a digital-to-analog converter including: differential switching circuitry embodying the aforesaid first aspect of the invention; and a current source or current sink connected operatively to the said common node of the differential switching circuitry for delivering thereto a substantially constant current.

According to a third aspect of the present invention there is provided a digital-to-analog converter including: a plurality of differential switching circuits, each being differential switching circuitry embodying the aforesaid first aspect of the present invention, the respective first output nodes of the differential switching circuits of the said plurality being connected together and the respective second output nodes of the differential switching circuits of the said plurality being connected together; and a plurality of current sources or current sinks, corresponding respectively to the differential switching circuits of the said plurality, each current source or current sink being connected operatively to its said corresponding differential switching circuit for delivering thereto a substantially constant current.

Embodiments of the second and third aspects of the invention can provide a "fully segmented" or "partially segmented" DAC in which the SFDR is significantly improved. In this case the currents sourced/sunk by the different current sources/sinks may be identical.

Alternatively the currents sourced/sunk by the different current sources/sinks may be binary-weighted.

In a preferred embodiment a cascading transistor is connected between the or each said current source or current sink and the said common node of the or each corresponding differential switching circuit. This helps to shield the transistors of the current sources/sinks from variations in their potentials that would otherwise affect the magnitudes of the currents sourced/sunk thereby as the common-node potential changes during operation of the DAC.

BRIEF DESCRIPTION OF THE DRAWINGS

FIG. 10 shows timing diagrams for use in explaining operation of the FIG. 8 implementation.

DETAILED DESCRIPTION OF THE PREFERRED EMBODIMENTS

Figure 3:
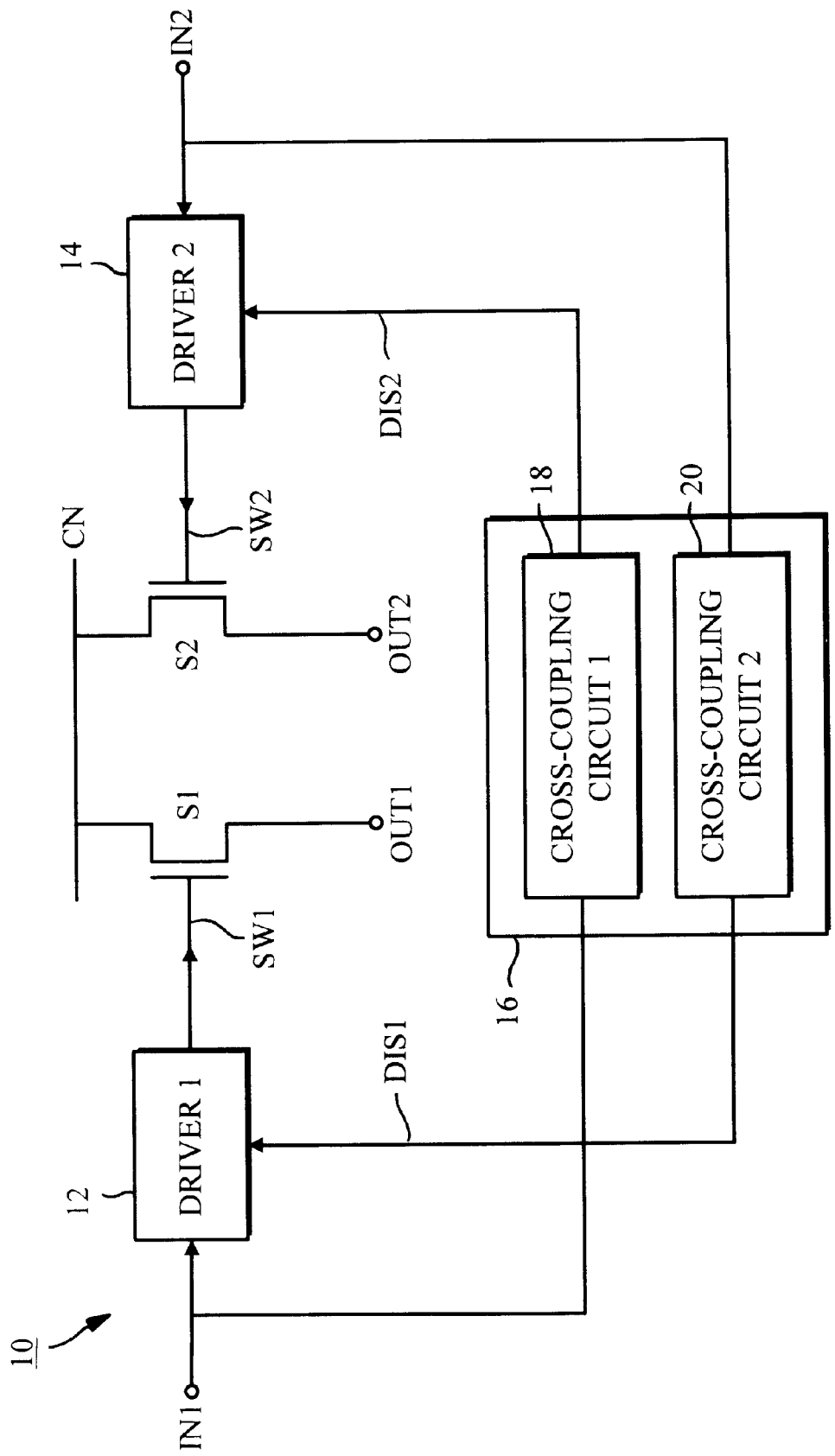
FIG. 3 shows parts of a differential switching circuit embodying the present invention.

FIG. 3 shows a block diagram of parts of a differential switching circuit 10 embodying the present invention. The circuit 10 includes respective first and second switch elements S1 and S2 which, in this example, are p-type field effect transistors (FETs). The respective sources of the two transistors are connected to a common node CN and the respective drains of the transistors are connected to respective first and second output nodes OUT1 and OUT2 of the circuit.

The differential switching circuit of FIG. 3 further includes first and second driver circuits 12 and 14, each driver circuit 12 or 14 having a main input for receiving one of two complementary input signals IN1 and IN2 of the circuit, and a disabling input for receiving a disabling signal DIS1 or DIS2. Each driver circuit 12 or 14 also has an output connected to the gate of its corresponding transistor S1 or S2 for applying a switching signal SW1 or SW2 to the gate.

The circuit 10 of FIG. 3 further includes cross-coupling circuitry 16 having a first cross-coupling circuit 18 and a second cross-coupling circuit 20. The cross-coupling circuit 18 is connected for receiving the first input signal IN1 and derives therefrom the disabling signal DIS2 for the second driver circuit 14. The cross-coupling circuit 20, on the other hand, is connected for receiving the second input signal IN2 and derives therefrom the disabling signal DIS1 applied to the first driver circuit 12.

The FIG. 3 circuit operates as follows. Each driver circuit 12 or 14 operates in one of two different states in dependence upon the disabling signal DIS1 or DIS2 applied thereto. When the disabling signal is not applied to the driver circuit the driver circuit operates in a responsive state in which the switching signal SW1 or SW2 produced by the driver circuit changes in response to a change in the input signal IN1 or IN2 applied to the driver circuit. If the driver circuit has an inverting function then, when the input signal changes from high to low in the responsive state, the switching signal produced by the driver circuit changes from low to high, and vice versa. If the driver circuit has a non-inverting function, the change in the switching signal is the same as the change in the input signal.

When the driver circuit receives the disabling signal, on the other hand, it is placed in a non-responsive state in which the switching signal SW1 or SW2 produced by the driver circuit is not changed in response to a change in the input signal IN1 or IN2 applied to the driver circuit concerned.

The cross-coupling circuitry 16 operates such that, when the complementary input signals IN1 and IN2 are stable (not changing), only one of the disabling signals DIS1 and DIS2 is produced. The driver circuit which receives the disabling signal is therefore placed in a non-responsive state and the driver circuit which does not receive a disabling signal is maintained in the responsive state. Thus, when complementary changes occur in the input signals IN1 and IN2, the driver circuit that is in the non-responsive state effectively ignores the input-signal change which it sees at its main input as long as the disabling signal is still provided.

The input signal IN1 or IN2 which is applied to the responsive driver circuit is also applied to that one of the cross-coupling circuits 18 and 20 which applies the disabling signal to the non-responsive driver circuit. Accordingly, the cross-coupling circuit concerned is able to detect the transition in the input signal of the responsive driver circuit and release the non-responsive driver circuit following the detection of that transition. Accordingly, the non-responsive driver circuit is changed to the responsive state following the detection of the input-signal change at the input of the responsive driver circuit. As a result, the initially-non-responsive driver circuit changes its switching signal in coordination with the change in the switching signal of the initially-responsive driver circuit.

Because the switching operations of the two driver circuits 12 and 14 are coordinated by the cross-coupling circuitry 16, it is no longer necessary for the complementary changes in the input signals IN1 and IN2 applied to the circuit of FIG. 3 to be perfectly symmetrical. The input signal applied to the initially-non-responsive driver circuit can change at any time before the complementary change in the initially-responsive driver circuit and even for a certain time after that complementary change.

Although as shown in FIG. 3 the disabling signals DIS1 and DIS2 are derived respectively from the input signals IN1 and IN2, it is not necessary for the cross-coupling circuits 18 and 20 to receive the input signals concerned directly. For example, each driver circuit inevitably produces various different signals internally which are derived from (dependent upon) the input signal applied to the main input of the driver circuit. Similarly, the switching signal generated by each driver circuit is also a signal derived from the input signal of the driver circuit concerned. Thus, in embodiments of the present invention it is possible to derive the disabling signals from internal signals of the driver circuits or from the switching signals themselves. For this reason the cross-coupling circuitry 16 may in some embodiments be coupled to the driver-circuit internal nodes or the driver-circuit outputs, rather than to the driver-circuit inputs. Furthermore, by designing the driver circuits appropriately, it is possible to simplify the cross-coupling circuitry, even to the extent that the cross-coupling circuitry simply consists of two cross-coupling connections between the two driver circuits 12 and 14.

As mentioned above, in the FIG. 3 circuit, the cross-coupling circuitry is such that, for any pair of complementary changes in the input signals, only one of the two driver circuits is initially in the responsive state, the other of the two circuits being in the non-responsive state initially. It is not critical which driver circuit is initially in the responsive state. For example, it may be chosen to have the driver circuit whose corresponding transistor S1 or S2 is in the OFF condition in the responsive state initially. In this case, as soon as the input signal of that responsive driver circuit starts to change, the cross-coupling circuit receiving this input signal detects the change therein and removes the disabling signal from the non-responsive driver circuit, thereby causing the ON transistor to start to turn OFF as soon as the OFF transistor starts to turn ON. Alternatively, the driver circuit whose corresponding transistor is ON could be chosen to be the driver circuit that is in the responsive state initially. In this case, as soon as the cross-coupling circuitry detects a transition in the input signal applied to the responsive driver circuit it removes the disabling signal from the non-responsive driver circuit, so that at the same time as the ON transistor starts to turn OFF under the control of the initially-responsive driver circuit, the OFF transistor starts to turn ON under the control of the initially non-responsive driver circuit.

Preferred embodiments of the present invention will now be described.

Figure 4:
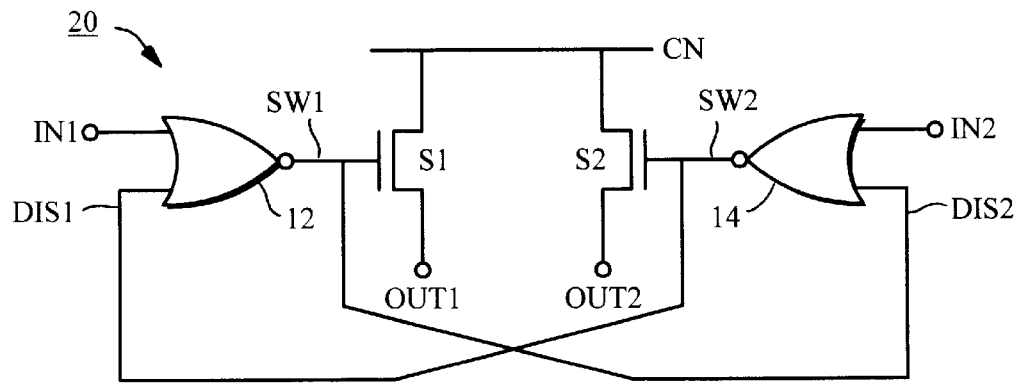
FIG. 4 shows a block circuit diagram of parts of a differential switching circuit according to a first embodiment of the present invention.

FIG. 4 shows a differential switching circuit 20 according to a first embodiment of the present invention. In this embodiment, the switching elements S1 and S2 are p-type FETs and the driver circuits 12 and 14 each have a NOR function. Thus, the switching signal produced by each driver circuit 12 or 14 is the logical NOR of the input signal IN1 or IN2 applied to that circuit and the switching signal produced by the other driver circuit. Thus, in this embodiment, the disabling signal DIS1 or DIS2 of each driver circuit is one and the same signal as the switching signal SW2 or SW1 of the other driver circuit.

Operation of the FIG. 4 embodiment will now be described with reference to FIGS. 5(A) to 5(C) and FIG. 6.

Figure 5A:
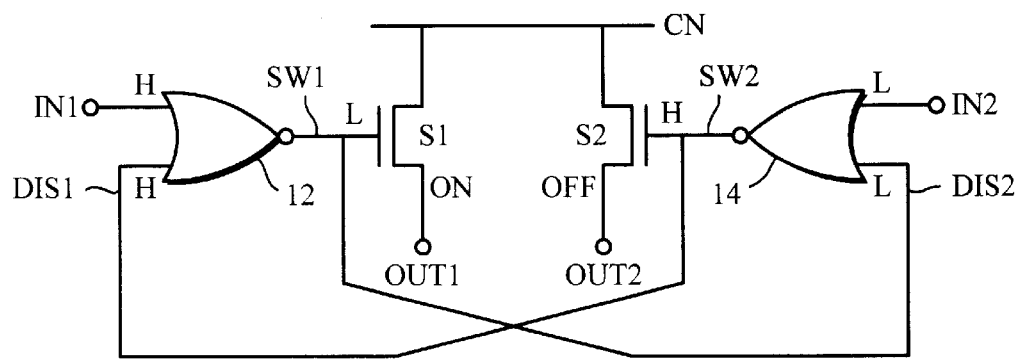
FIGS. 5(A) to 5(C) are respective diagrams for use in explaining operation of the first embodiment.

FIG. 5(A) shows an initial condition of the FIG. 4 circuit. In this initial condition, it is assumed that the first input signal IN1 is at the high logic level H and the second input signal IN2 (complementary to the first input signal IN1) is at the low logic level L. The switching signals SW1 and SW2 applied to the switch elements S1 and S2 are L and H respectively so that S1 is ON and S2 is OFF. Also, in the initial condition, the first driver circuit 12 receives the disabling signal (DIS1=H), placing it in the non-responsive state, but the second driver circuit receives no disabling signal (DIS2=L) and is accordingly in the responsive state.

Figure 5B:
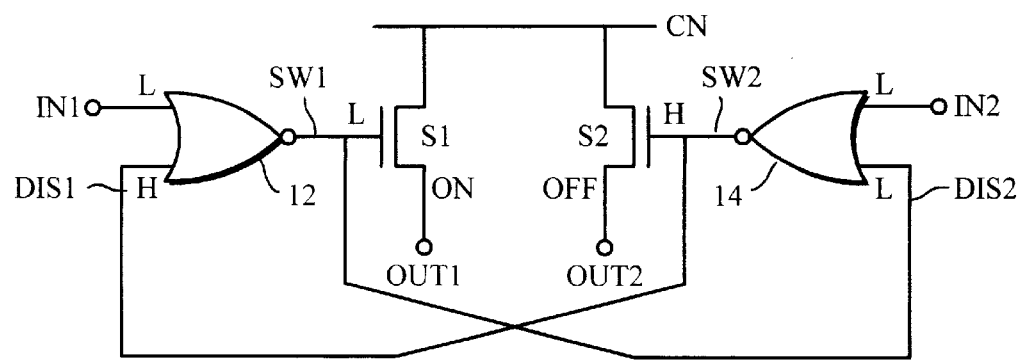

In FIG. 5(B), the input signal IN1 changes from H to L but the corresponding change in the second input signal IN2 (from L to H) has not yet occurred. Thus, the disabling signal for the first driver circuit 12, which is derived from the second input signal IN2, remains at the H level, so that the output of the first driver circuit is prevented from changing in response to the change in the first input signal IN1. Accordingly, the switch element S1 remains ON and the switch element S2 remains OFF.

Figure 5C:
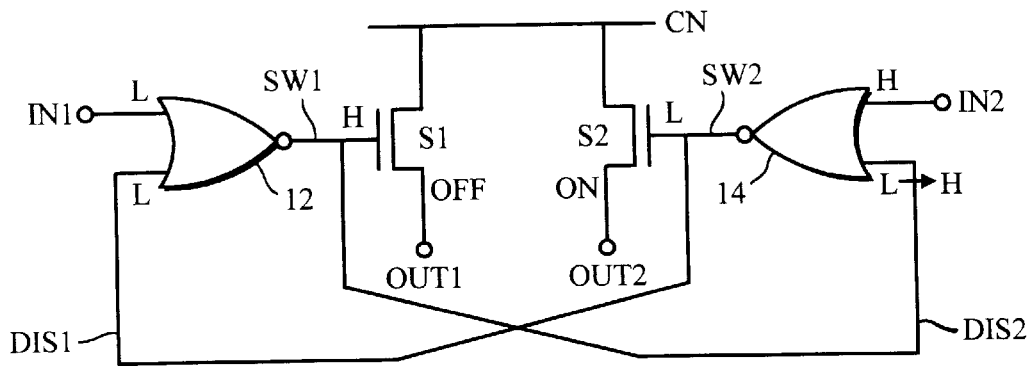

In FIG. 5(C), IN2 changes from L to H. In this case, because the second driver circuit 14 is in the responsive state (no disabling signal provided) the switching signal SW2 starts to change from H to L. Thus, the switch element S2 starts to turn ON. At the same time, the disabling signal DIS1 applied to the first driver circuit 12 changes from H to L, so that the switching signal SW1 starts to change from L to H, thereby starting to turn OFF the switch element S1. In this way, the turning OFF of the switch element S1 is coordinated with the turning ON of the switch element S2.

It will be seen that in FIG. 5(C), the second driver circuit 14 ends up in the non-responsive state, because it receives the disabling signal DIS2 when the first switching signal SW1 changes to H. Accordingly, when the next change in the complementary input signals IN1 and IN2 occurs, only the first driver circuit 12 is initially responsive to the change (in the first input signal IN1), the second driver circuit 14 being maintained in the non-responsive state until the change (from L to H) in the first input signal has occurred.

Figure 6:
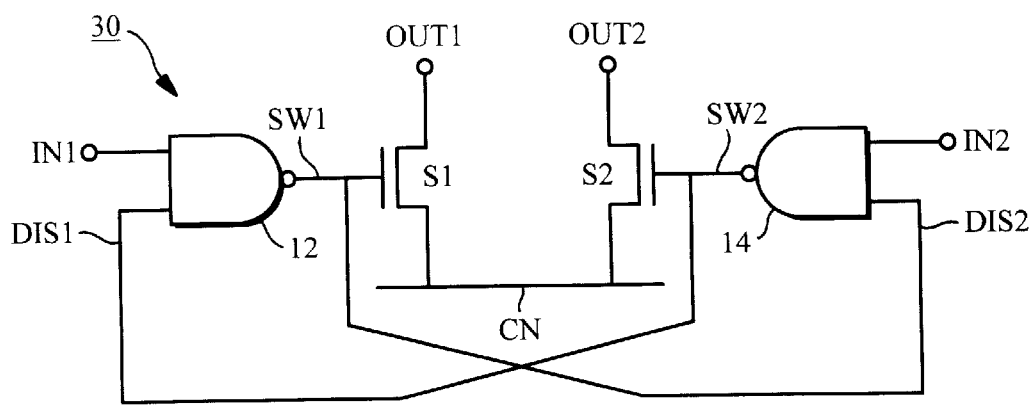
FIG. 6 is a block circuit diagram of parts of a differential switching circuit according to a second embodiment of the present invention.

FIG. 6 shows a differential switching circuit 30 according to a second embodiment of the present invention. In this embodiment, the switch elements S1 and S2 are respective n-type FETs and the first and second driver circuits 12 and 14 each have a NAND function. The switching signal SW1 or SW2 produced by each driver circuit is the logical NAND of the input signal IN1 or IN2 applied to the circuit and the disabling signal DIS1 or DIS2 applied to the circuit concerned. As in the FIG. 4 embodiment, the disabling signal DIS1 or DIS2 for each driver circuit is provided directly by the switching signal SW2 or SW1 of the other driver circuit but, in this embodiment, each disabling signal DIS1 and DIS2 is active-low.

Figure 7A:
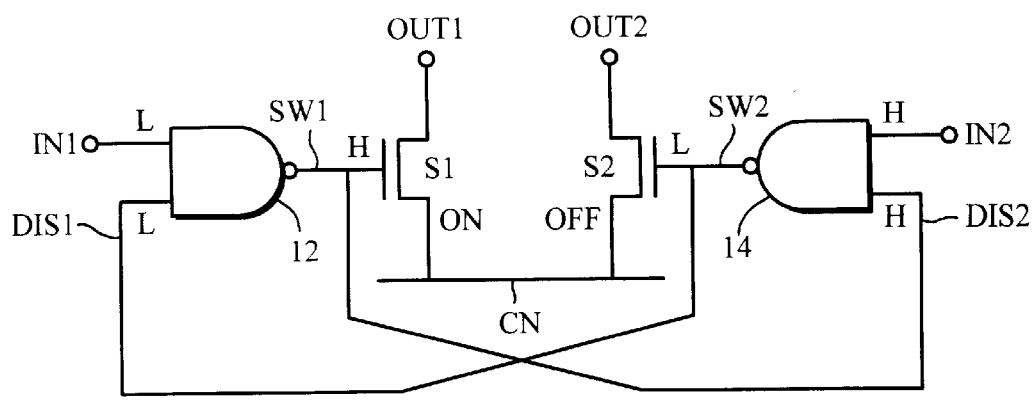
FIGS. 7(A) to 7(C) show respective diagrams for use in explaining operation of the second embodiment.
Figure 7B:
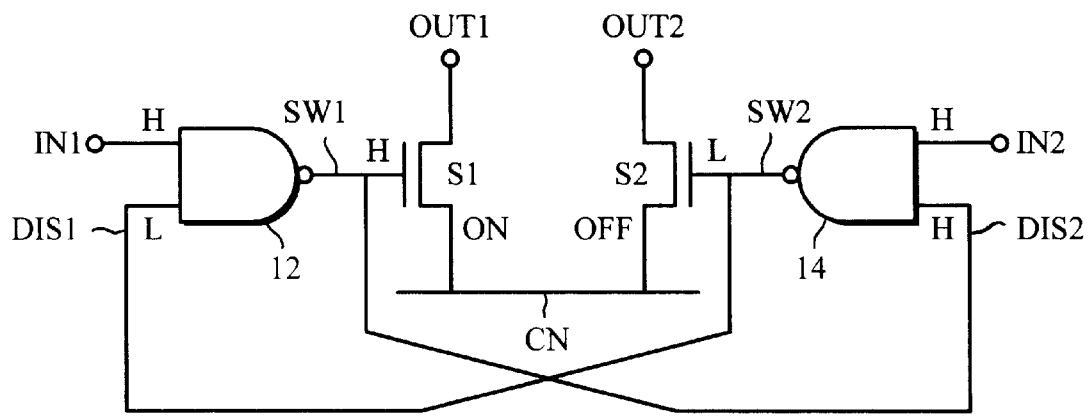
Figure 7C:
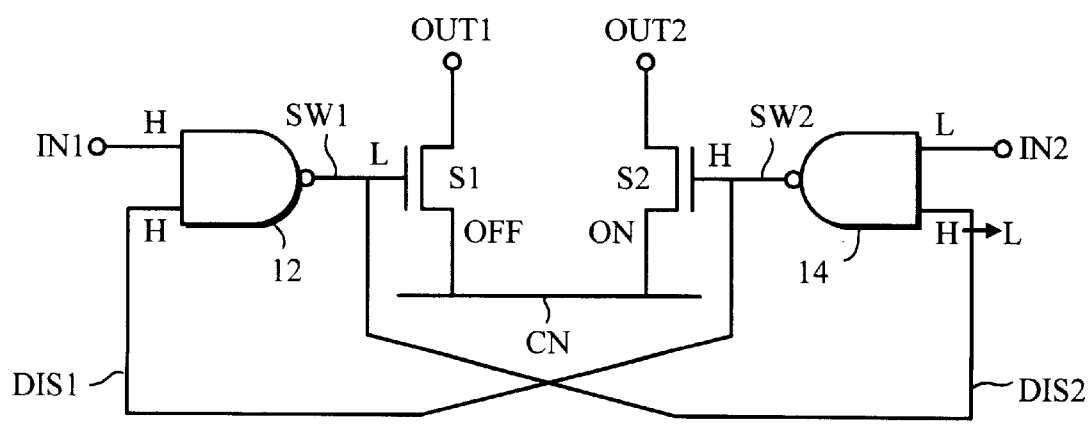

Operation of the differential switching circuit 30 of FIG. 6 is illustrated by FIGS. 7(A) to 7(C) which correspond respectively to FIGS. 5(A) to 5(C) of the first embodiment.

As shown in FIG. 7(A), in the initial condition, the input signals are assumed to be: IN1=L and IN2=H. Thus, the switching signal SW1=H and the switching signal SW2=L so that the switch element S1 is ON and the switch element S2 is OFF. In this condition, the first driver circuit 12 is in the non-responsive condition because it receives the disabling signal DIS1 as a result of the second switching signal SW2 being L. The second driver circuit 14, on the other hand, is in the responsive state (no disabling signal DIS2).

In FIG. 7(B), the first input signal IN1 changes from L to H. However, since the first driver circuit 12 is in the non-responsive state, the first switching signal SW1 stays at H, and the switch element S1 remains ON and the switch element S2 remains OFF. This state is maintained until, as shown in FIG. 7(C), the second input signal IN2 changes from H to L. As the second driver circuit 14 is in the responsive state, the switching signal SW2 starts to change from L to H so that the switch element S2 starts to turn ON. At the same time, the disabling signal DIS1 is removed from the first driver circuit 12, so that the first switching signal SW1 starts to change from H to L. Thus, at the same time as S2 starts to turn ON, S1 starts to turn OFF.

It will be seen that in FIG. 7(C), the first driver circuit 12 ends up in the responsive state whilst the second driver circuit 14 ends up in the non-responsive state. Thus, when the next complementary changes occur in the input signals IN1 and IN2, only the first driver circuit 12 is responsive to the change (in the input signal IN1) and the second driver circuit 14 is maintained in the non-responsive state until such time as the change in the first input signal IN1 (from H to L) has occurred.

Figure 8:
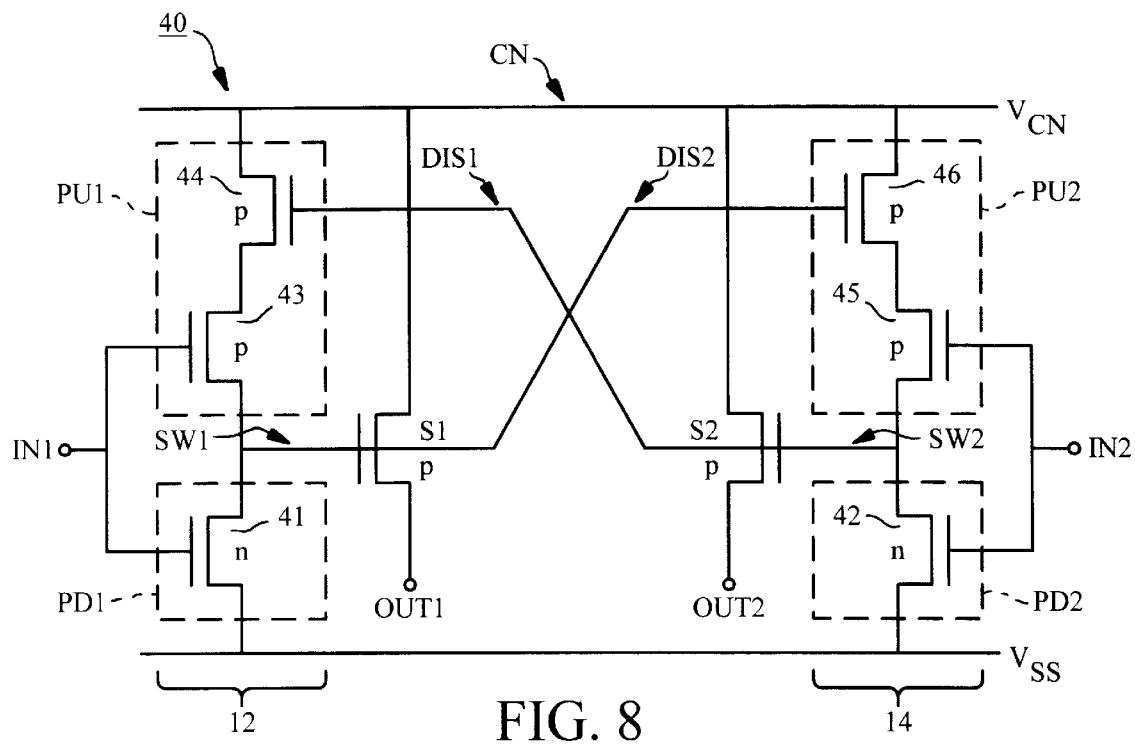
FIG. 8 is a circuit diagram showing a first implementation of the first embodiment.

FIG. 8 shows a possible transistor-level implementation of the first embodiment (FIG. 4). The circuit 40 shown in FIG. 8 has first and second p-type FETs S1 and S2. The respective drains of the transistors S1 and S2 are connected respectively to first and second output nodes OUT1 and OUT2 of the circuit 40, and the respective sources of the transistors S1 and S2 are connected to a common node CN.

Associated with each transistor S1 or S2 is a driver circuit 12 or 14 which comprises a pull-up circuit PU1 or PU2 and a pull-down circuit PD1 or PD2. Each pull-down circuit PD1 or PD2 comprises an n-type FET 41 or 42 connected between a power supply line Vss of the circuit 40 and the gate of the transistor S1 or S2. An input signal IN1 or IN2 is applied to the gate of the transistor 41 or 42.

Each pull-up circuit PU1 or PU2 comprises two p-type FETs (43 and 44 for PU1 and 45 and 46 for PU2) connected in series between the gate of the switch transistor S1 or S2 and the common node CN. The transistors 43 and 45 receive respectively the input signals IN1 and IN2 at their gates. The transistors 44 and 46 are disabling transistors which receive respectively disabling signals DIS1 and DIS2. These disabling signals DIS1 and DIS2 are cross-coupled respectively from the gates of the switching transistors S2 and S1 (in other words the switching signal SW1 produced by the first driver circuit 12 provides the disabling signal DIS2 directly, whilst the switching signal SW2 produced by the second driver circuit 14 provides directly the disabling signal DIS1). The order of the two p-type FETS in each pull-up circuit PU1 or PU2 can be reversed, if desired.

Operation of the FIG. 8 circuit will now be described with reference to FIGS. 9(A) to 9(C) and the timing diagram of FIG. 10.

Figure 9A:
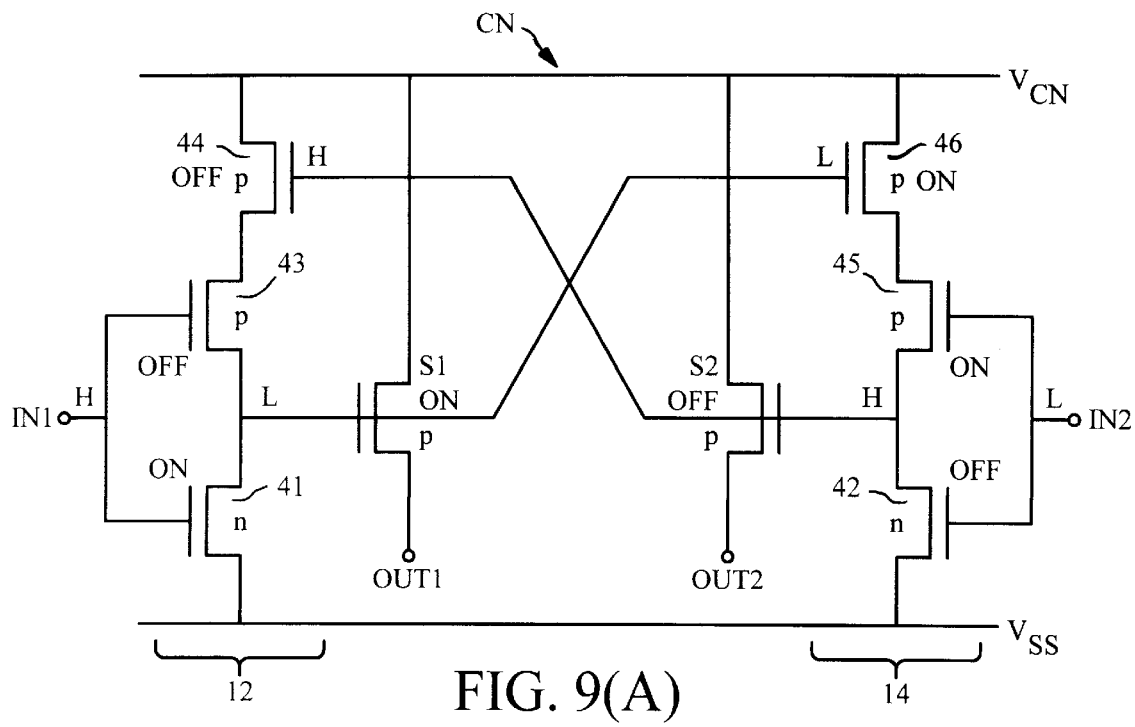
FIGS. 9(A) to 9(C) show respective diagrams for use in explaining operation of the FIG. 8 implementation.

In FIG. 9(A) it is assumed that initially the first input signal IN1=H and the second input signal IN2 (complementary to the first input signal IN1)=L. Accordingly, the transistors 41, 45, 46 and S1 are ON, and the transistors 42 to 44 and S2 are OFF. As the disabling transistor 44 of the first driver circuit 12 is OFF (because it is receiving the disabling signal DIS1=H), the first driver circuit 12 is in the non-responsive state, whereas the second driver circuit 14 is in the responsive state because its disabling transistor 46 is ON.

Figure 9B:
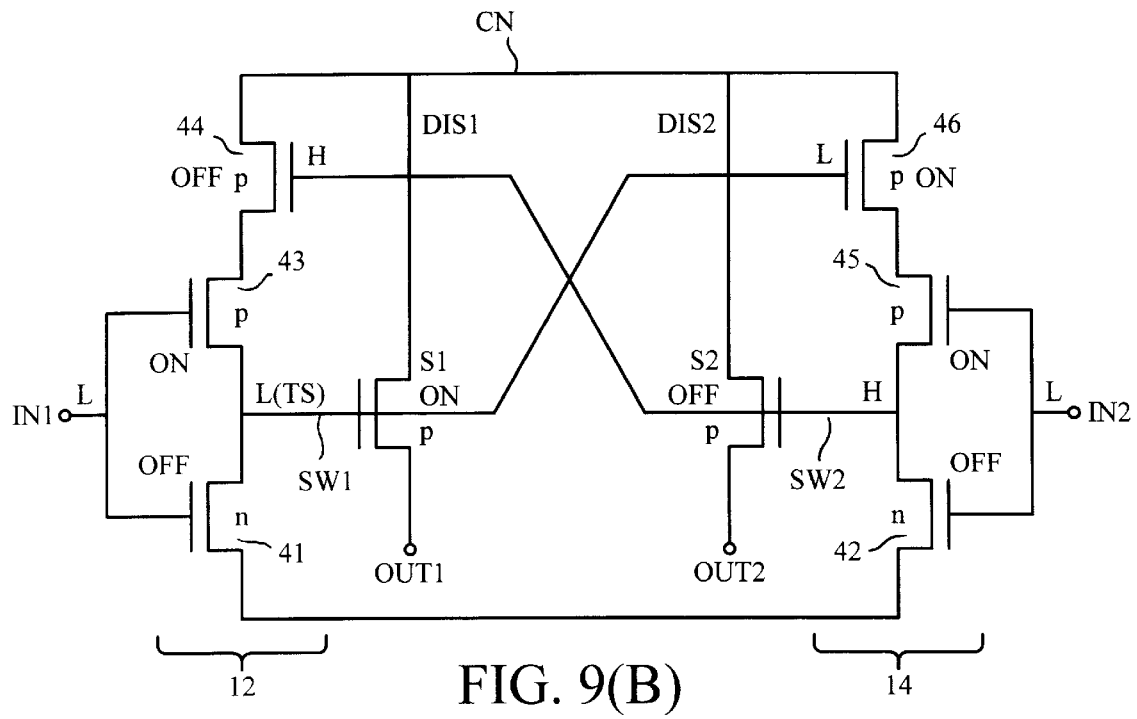

In FIG. 9(B) IN1 changes from H to L before IN2 changes from L to H. As a result, transistor 41 in the first driver circuit 12 is turned OFF which effectively places the first switching signal SW1 in a high-impedance (or tri-state TS) condition in which it is not actively driven (i.e. connected neither to the common node CN nor to the supply line Vss), as shown by the dotted line in FIG. 10. However, since the first switching signal SW1 was L before entering the high-impedance condition, it remains at the low level L so that S1 remains ON. It will be appreciated that the disabling transistor 44 of the first driver circuit 12 receives the disabling signal DIS1 as long as IN2 remains L. It is this disabling transistor 44 which prevents the change in IN1 from changing the first switching signal SW1.

Figure 9C:
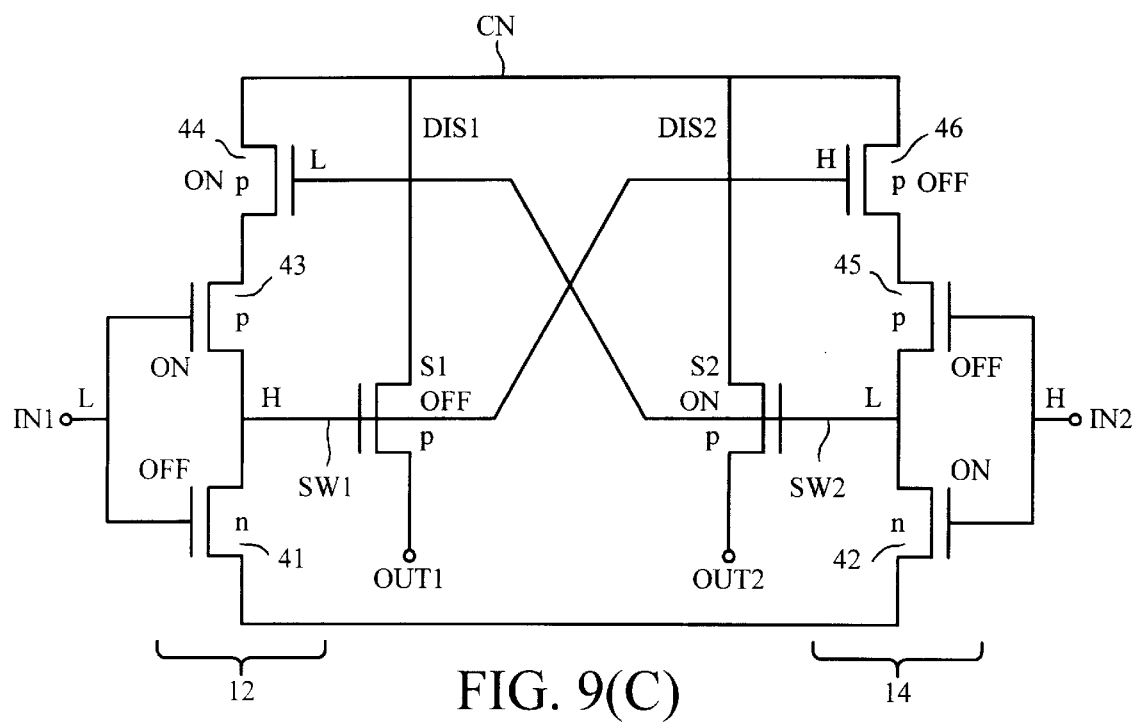

When IN2 changes from L to H as shown in FIG. 9(C), the transistor 42 turns ON and the transistor 45 turns OFF in the second driver circuit 14. The transistor 46 is initially ON because SW1 is at this time still at L (tri-state condition). As a result, SW2 starts to change from H to L. When the potential difference between the common node and the gate of transistor S2 exceeds the threshold voltage $V_{TP}$ of the transistor S2, the transistor S2 starts to turn ON. At the same time, the disabling transistor 44 also starts to turn ON when the potential difference between its gate and source terminals exceeds its threshold voltage $V_{TP}$. The first driver circuit 12 is thereby changed from being in the non-responsive state to being in the responsive state and the first switching signal SW1 is pulled up by the pull-up circuit PU1 so that the transistor S1 starts to turn OFF at the same time as the transistor S2 starts to turn ON.

In the FIG. 8 circuit, it will be seen that the disabling transistor 44 is matched with the second switching transistor S2 in the sense that the sources of the two transistors 44 and S2 have the same potential $V_{CN}$ and the gates of the two transistors also receive the same potential SW2. The switching transistor S1 and the disabling transistor 46 also form such a matched pair (in this case the gate potentials are both SW1). By virtue of this feature, the rate at which the disabling transistor turns on matches the rate at which the switching transistor with which it is paired is turned ON. Thus, the moment at which the gate signal of the other switching transistor (e.g. S1) starts to rise matches the moment at which the switching transistor (S2) paired with the disabling transistor (44) starts to turn ON.

It is not essential for the pull-up circuits PU1 and PU2 in FIG. 8 to be connected to the common node CN. The pull-up circuit PU1 and PU2 could be connected to potentials other than $V_{CN}$, but it is desirable that these potentials should at least be compatible with $V_{CN}$, for example they should track $V_{CN}$ (i.e. have a constant or small-variation offset from it). It may be desirable to include such an offset when the transistor parameters of a matched pair (made up of a disabling transistor and a corresponding switching transistor) must be different, for example because of the different current which it is required to pass through the transistors when ON.

In the FIG. 8 circuit, the transistors 43 and 45 of the pull-up circuits PU1 and PU2 serve to prevent a possible situation in which the disabling transistor and pull-down transistor of the same driver circuit are both ON momentarily at the same time. The transistors 43 and 45 could be eliminated if it can be guaranteed by some other means that the disabling transistor and pull-down transistor of the same driver circuit cannot both be in the ON condition simultaneously (guaranteed non-overlap).

Figure 11:
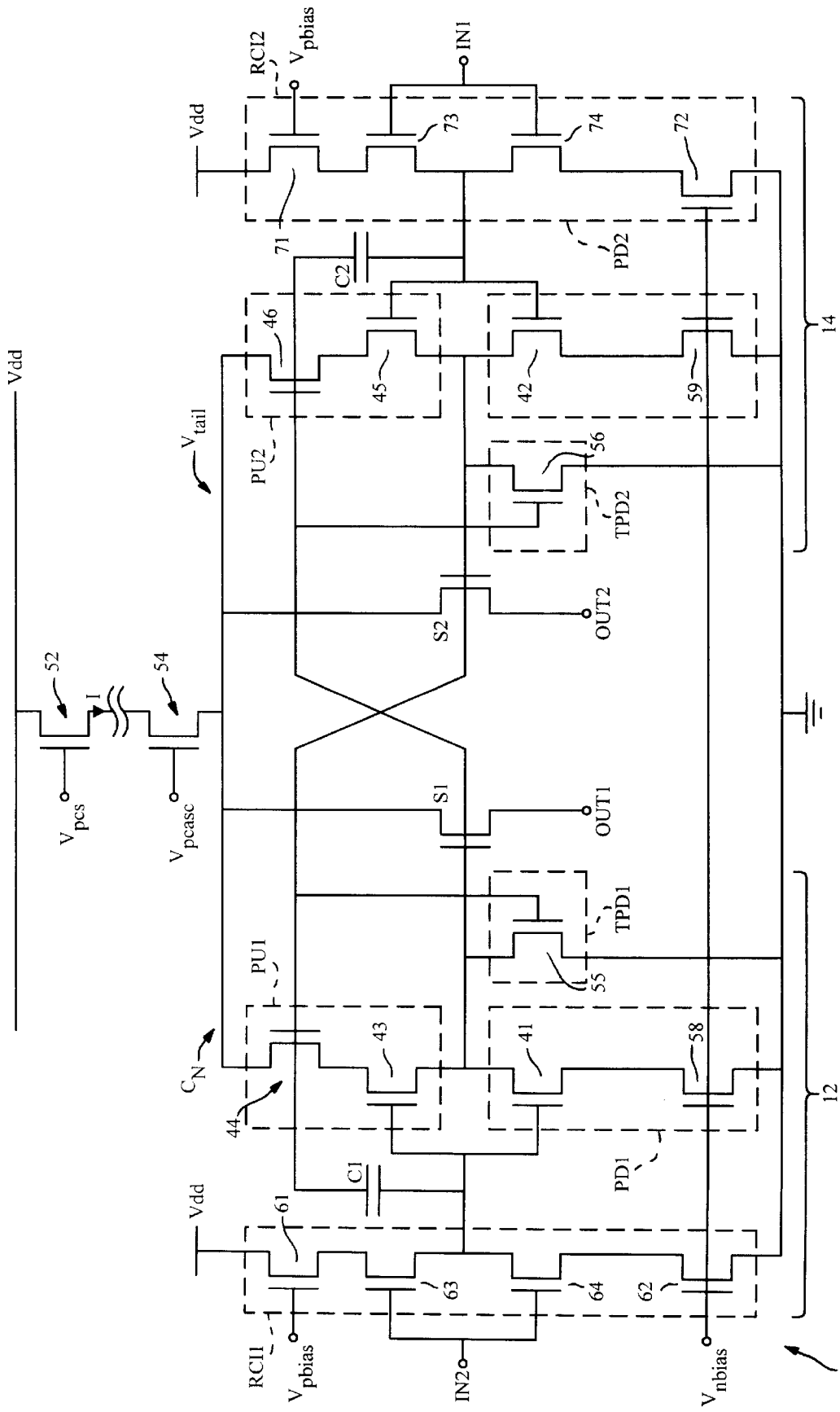
FIG. 11 is a circuit diagram of another implementation of the first embodiment for use in a DAC.

Referring now to FIG. 11, another preferred implementation of the first embodiment at the transistor level is shown.

Figure 1:
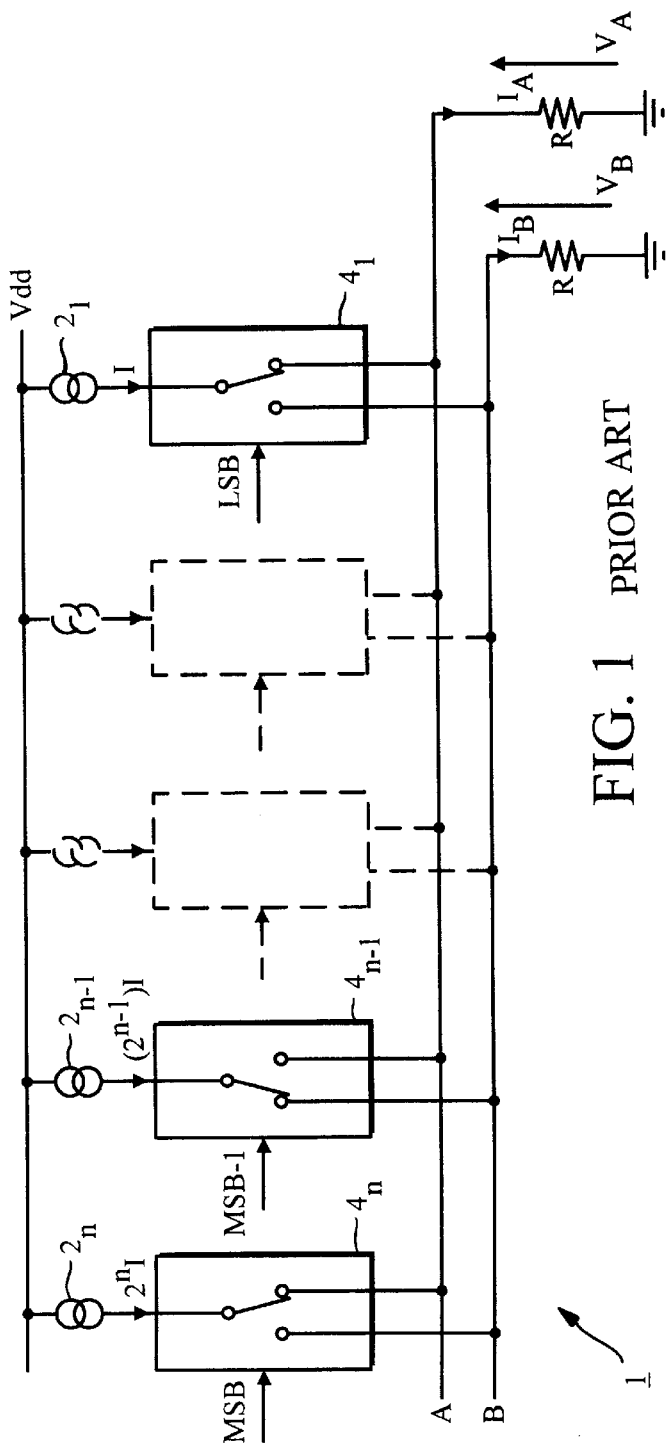
FIG. 1, discussed hereinbefore, shows parts of a previously-considered current-switched DAC.
Figure 2:
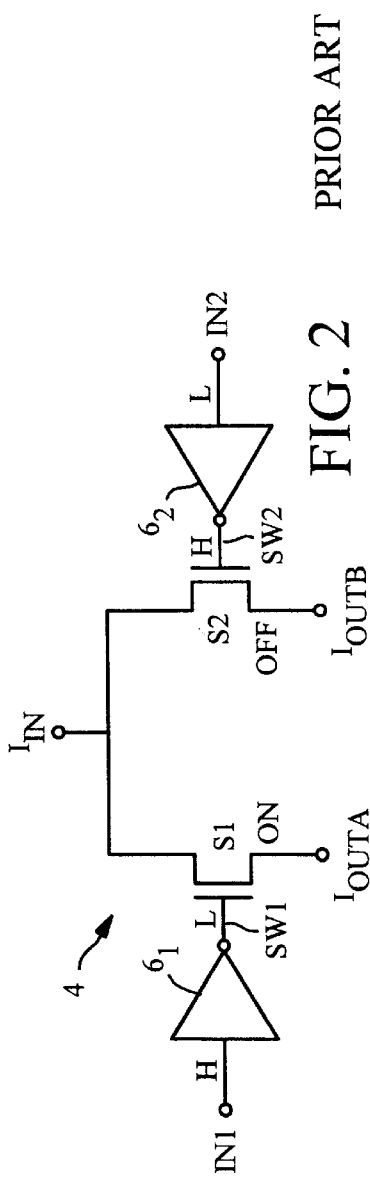
FIG. 2 shows parts of a differential switching circuit previously considered for use in a DAC.

Such a circuit is suitable for use in a DAC and, for completeness, FIG. 11 shows, in addition to the differential switching circuit 50, a current source 52 and a cascoding transistor 54 connected in series between a common node CN of the differential switching circuit 50 and a supply line Vdd. The current source 52 corresponds, for example, to one of the binary-weighted current sources $2_1$ to $2_n$ shown in FIG. 1. However, it is not necessary for the current sources to be binary weighted. It is also possible for the current sources to be identical, as in a so-called "segmented" or "partially segmented" DAC architecture, as described for example in "Principles of Data Conversion System Design", Behzad Razavi, pp. 90 to 94. The current source 52 is provided by a large p-type FET (or possibly several parallel-connected smaller p-type FETS) whose gate is (or gates are) connected to receive a bias voltage $V_{pcs}$ which is fixed in relation to Vdd. The cascoding transistor 54 is also a p-type FET which receives at its gate a further predetermined bias voltage $V_{pcasc}$ which is also fixed in relation to Vdd. The cascoding transistor 54 maintains the drain of the current source transistor 52 at a fixed voltage and so shields the current source transistor from voltage swings at its output that would otherwise be caused by variations in the voltage $V_{tail}$ of the common node CN of the differential switching circuit 50 as the potentials of the output nodes OUT1 and OUT2 of that circuit change. The connection between the drain of the current source transistor 52 and the source of the cascading transistor 54 may be relatively long, so as to facilitate layout flexibility bearing in mind that the current source transistor 52 is a large transistor (or several small transistors connected in parallel). The cascading transistor may be omitted in some designs.

It is also possible to employ a current sink circuit in place of the current source circuit shown in FIG. 11, in which case the conductivity types of the transistors are reversed and the bias potentials for the transistors S2 and S4 should be fixed in relation to Vss.

It will be seen that the differential switching circuit 50 in FIG. 11 includes elements corresponding to the elements PU1, PU2, PD1, PD2, S1, S2 and 41 to 46 of the differential switching circuit 40 of FIG. 8 and the same reference numerals are used in both drawings accordingly.

In the FIG. 11 differential switching circuit 50 each driver circuit 12 or 14 further includes a tri-state pull-down circuit TPD1 or TPD2 having an n-type FET 55 or 56. This n-type transistor has its gate connected to receive the disabling signal DIS1 or DIS2 of its driver circuit 12 or 14, and has its source connected to Vss and its drain connected to the gate of the switching transistor S1 or S2 driven by its driver circuit. The tri-state pull down circuits PD1 and PD2 are provided in the driver circuits 12 and 14 to prevent the switching signal SW1 or SW2 of the driver circuit from being in a tri-state (high-impedance) condition prior to the disabling transistor 44 or 46 of the driver circuit turning ON (see the dotted line of the "S1 GATE" waveform in FIG. 10). The n-type transistor 55 or 56 in the tri-state pull down circuit is held in the ON condition as long as the disabling signal applied to the driver circuit is present. Thus, the switching signal of the driver circuit concerned is held low until the disabling signal is removed, preventing possible problems due to changes in the gate potential of the switching transistor being driven by the driver circuit when the pull-down circuit PD1 or PD2 of the driver circuit is inactive due to an input-signal change.

The FIG. 11 differential switching circuit also includes, in each pull-down circuit PD1 or PD2, a further n-type transistor 58 or 59 in addition to the transistors 41 and 42 shown in FIG. 8. These transistors 58 and 59 are connected in series with the transistors 41 and 42 respectively and receive at their respective gates a predetermined bias voltage $V_{nbias}$ that is fixed in relation to Vss. The transistors 58 and 59 serve respectively as constant current sinks which control the rate of change of the switching signals SW1 and SW2 when the pull-down circuits are activated. This is helpful in avoiding glitches in the output node potentials that would otherwise be caused by rapid switching of the switching transistors S1 and S2.

The differential switching circuit 50 of FIG. 11 further includes respective first and second rate-controlled inverter circuits RCI1 and RCI2 which receive respectively complementary input signals IN2 and IN1 of the circuit. Each rate-controlled inverter circuit RCI1 or RCI2 includes a current source transistor 61 or 71 connected between Vdd and a predetermined bias potential $V_{pbias}$ that is fixed in relation to Vdd. Each rate-controlled inverter circuit RCI1 or RCI2 further includes a current sink transistor 62 or 72 that receives at its gate the predetermined bias voltage $V_{nbias}$ (or if desired, another predetermined bias voltage, different from $V_{nbias}$, that is also fixed in relation Vss, for example so as to reduce coupling between drivers). Each rate-controlled inverter circuit RCI1 or RCI2 further includes an inverter made up of a p-type transistor 63 or 73 and an n-type transistor 64 or 74, the transistors of the inverter being connected in series between the current source and current sink transistors 61 and 62 or 71 and 72. The two transistors of the inverter receive at their gates the input signal IN1 or IN2.

The rate-controlled inverters RCI1 and RCI2 control the rate of rise and fall of the gate drive signals applied to the pull-up and pull-down circuits of the driver circuits 12 and 14. Accordingly, when the two input signals IN1 and IN2 undergo their complementary changes, the output signal of one of the two rate-controlled inverter circuits rises at the same rate as the output of the other of the rate-controlled inverter circuits falls, thereby avoiding potential glitches in the output-node voltages of the circuit. In addition, the current source and current sink transistors 61, 71, 62 and 72 serve to limit the rise and fall rates of the output signals suitably so as to avoid excessively large currents flowing at the input-signal transitions.

The FIG. 11 differential switching circuit 50 further includes first and second cross-coupling capacitors C1 and C2 which serve to couple the output of each rate-controlled inverter circuit to the gate of the switching transistor S1 or S2 driven by the other driver circuit. These cross-coupling capacitors are provided in view of the following phenomenon.

Referring to FIGS. 9(A) and 9(B) again, the initially-non-responsive driver circuit 12 has at its input (IN1 in FIG. 9(A)) the high logic level H. The transistor 43 in this driver circuit has a parasitic capacitance between its gate and source electrodes (overlap capacitance) and, when the gate is at H and the source is at L, the charge stored in this parasitic capacitance is equal to the product of the parasitic capacitance $C_{gs}$ and the gate-source potential $V_{gs}$ ($V_{dd}$). When the input signal IN1 in FIG. 9(A) changes from H to L, as shown in FIG. 9(B), the charge stored in the parasitic capacitance of the transistor 43 is coupled to the gate of the switching transistor S1 which, at this time, should be L and not moving yet. This tends to pull the gate potential of S1 below the negative supply Vss, even though the transistor 55 in the tri-state pull-down circuit TPD1 (FIG. 11) serves partially to prevent this from happening, at least until it turns OFF.

To overcome this problem, the cross-coupling capacitors C1 and C2 are included in the FIG. 11 circuit which serve to couple into the gate of the switching transistor that is ON a signal which rises when the above-mentioned negative-pulling of the gate potential would occur. In the case shown in FIGS. 9(A) and 9(B), for example, such a rising signal is available at the output of the rate-controlled inverter circuit RCI2 and accordingly this rising signal is coupled via the capacitor C2 to the gate of the switching transistor S1 to compensate for the negative-pulling of the gate potential.

Because the rate-controlled inverter circuits RCI1 and RCI2 have matched rates of rise and fall of their outputs, the rate of rise of the output of the circuit RCI2 matches the rate of fall of the output of the circuit RCI1, and it is ensured that the charge compensation is accurate.

The capacitors C1 and C2 can be provided by respective FETs, each having its source and drain electrodes connected in common as one electrode of the capacitor and the gate as the other electrode of the capacitor.

The FETs providing C1 and C2 are preferably of the same conductivity type (i.e. p-type in the FIG. 11 embodiment) as the transistors 43 and 45. Furthermore the size of the capacitor FETs should match the size of the transistors 43 and 45 so as to ensure that the capacitance of the capacitor FETs matches the parasitic capacitance of the transistors 43 and 45.

What I claim is:

1. Differential switching circuitry including:
   a first switch element connected between a common node of the circuitry and a first output node of the circuitry;
   a second switch element connected between said common node and a second output node of the circuitry;
   first and second driver means corresponding respectively to said first and second switch elements, each connected to its corresponding switch element for switching that element between respective first and second states in dependence upon an applied input signal, one of the first and second states being an ON state and the other of those two states being an OFF state, the first and second driver means co-operating such that one of the two switch elements has said first state when the other of the two switch element has said second state;
   wherein each said switch element is paired with a matching element in the driver means corresponding to the other said switch element, which matching element is coupled operatively to the driver means corresponding to its paired switch element and is matched with its paired switch element such that a predetermined switching operation of the matching element is matched with switching of its paired switch element from said first state to said second state, that predetermined switching operation serving to bring about switching of said other switch element from said second state to said first state.

2. Circuitry as claimed in claim 1, wherein:
   each driver means has an input for receiving an input signal and an output connected to its corresponding switch element for applying a switching signal thereto to switch the element between its said first and second states, said input signals received respectively at the first-driver-means input and said second-driver-means input being mutually complementary;
   each driver means is switchable, by application thereto of a disabling signal, from a responsive state in which it is operable to change its said switching signal in response to an input-signal change at its said input, to a non-responsive state in which said switching signal is not changed in response to such an input-signal change;
   the circuitry further comprising cross-coupling means connected for deriving said disabling signal for each of the first and second driver means from said input signal of the other driver means such that when the respective input signals undergo complementary changes one of said driver means is initially in said responsive state and the other of said driver means is initially in said non-responsive state.

3. Circuitry as claimed in claim 2, wherein each said switch element is a p-type conductivity transistor and said switching signal applied by each driver means to its said corresponding switch element is the logical NOR of its said input signal and its said disabling signal.

4. Circuitry as claimed in claim 3, wherein each driver means includes a disabling transistor, of the same conductivity type as said switch-element transistors, which, when turned ON, serves to bring the switching-signal potential to an OFF potential at which said corresponding switch element of that driver means is turned OFF.

5. Circuitry as claimed in claim 4, wherein said disabling transistor is said matching element in each driver means.

6. Circuitry as claimed in claim 2, wherein each said switch element is an n-type conductivity transistor and said switching signal applied by each driver means to its said corresponding switch element is the logical NAND of its said input signal and its said disabling signal.

7. Circuitry as claimed in claim 6, wherein each driver means includes a disabling transistor, of the same conductivity type as said switch-element transistors, which, when turned ON, serves to bring the switching-signal potential to an OFF potential at which said corresponding switch element of that driver means is turned OFF.

8. Circuitry as claimed in claim 7, wherein said disabling transistor is said matching element in each driver means.

9. Circuitry as claimed in claim 2, wherein each said driver means includes:
first and second supply lines;
a first circuit selectively activatable to pull the potential of said output towards the first-supply-line potential so as to turn said corresponding switch element ON; and
a second circuit selectively activatable to pull the output potential towards the second-supply-line potential so as to turn said corresponding switch element OFF.

10. Circuitry as claimed in claim 2, further comprising respective first and second rate control means for generating said first and second mutually-complementary input signals respectively, each said rate control means serving to control a slew rate of the input signal it generates.

11. Circuitry as claimed in claim 10, wherein said first and second rate control means serve to equalise the respective slew rates of the first and second input signals.

12. Circuitry as claimed in claim 9, wherein operation of said second circuit is disabled by said disabling signal.

13. Circuitry as claimed in claim 9, wherein said first circuit includes current control means for controlling the rate at which the output potential is pulled towards the first-supply-line potential when the first circuit is activated.

14. Circuitry as claimed in claim 9, wherein each said driver means further includes open-circuit avoidance means for maintaining the output potential at a predetermined ON potential, such as to maintain said corresponding switch element in an ON condition, when neither said first nor said second circuit of the driver means concerned is activated.

15. Circuitry as claimed in claim 9, wherein said second-supply-line potential is equal to or close to the potential of said common node.

16. Circuitry as claimed in claim 2, further comprising compensation means connected to each said switch element for compensating for charge coupled from the initially-non-responsive driver means to its said corresponding switch element when the input signal of that driver means changes.

17. Circuitry as claimed in claim 16, wherein said compensation means are operable to effect such compensation by cross-coupling a countercharge to said switch element corresponding to the initially-non-responsive driver means when the input signal of the initially-responsive driver means changes.

18. Circuitry as claimed in claim 16, wherein said compensation means comprise, for each said driver means, a capacitor that is operatively coupled between said output of the driver means concerned and said input of the other driver means.

19. Circuitry as claimed in claim 2, wherein the initially-non-responsive driver means is the driver means whose corresponding switch element is ON when said respective input signals undergo complementary changes.

20. Circuitry as claimed in claim 2, wherein said disabling signal for each of the first and second driver means is derived from said switching signal produced by the other driver means.

21. Circuitry as claimed in claim 2, wherein said disabling signal for each of the first and second driver means is one and the same signal as said switching signal produced by the other driver means.

22. Circuitry as claimed in claim 1, wherein for each matched pair of elements, made up of one of the switch elements and its said matching element, the elements of the pair comprise respective field-effect transistors.

23. Circuitry as claimed in claim 22, wherein a gate-source voltage of each matching element is matched with a gate-source voltage of its paired switch element when the circuitry is in use.

24. Circuitry as claimed in claim 22, wherein a gate of the transistor of each matching element is maintained at a potential that is substantially equal to, or that tracks, a gate potential of the transistor of its paired switch element when the circuitry is in use.

25. Circuitry as claimed in claim 22, wherein a source of the transistor of each matching element is maintained at a potential that is substantially equal to or that tracks a source potential of the transistor of its paired switch element when the circuitry is in use.

26. Circuitry as claimed in claim 1, wherein each said switch element is switched from said first state to said second state by a main switching signal applied thereto, and each matching element is caused to perform its said predetermined switching operation by a matching switching signal applied thereto, and for each matched pair of elements, made up of one of the switch elements and its said matching element, the matching switching signal applied to the matching element has an effective value that is matched with an effective value of the main switching signal applied to the switch element.

27. Circuitry as claimed in claim 1, wherein each said matching element has a terminal whose potential is maintained at a potential that is substantially equal to, or that tracks, the common-node potential when the circuitry is in use.

28. Circuitry as claimed in claim 1, wherein each said matching element has a terminal connected directly to said common node.

29. Circuitry as claimed in claim 1, wherein each said matching element has a control terminal whose potential is maintained at a potential that is substantially equal to, or that tracks, the potential of a control terminal of its paired switch element when the circuitry is in use.

30. Circuitry as claimed in claim 1, wherein each said matching element has a control terminal that is connected directly to a control terminal of its paired switch element.

31. Circuitry as claimed in claim 1, wherein for each matched pair of elements, made up of one of the switch elements and its said matching element, the elements of the pair comprise respective transistors of the same conductivity type.

32. Circuitry as claimed in claim 1, wherein in said predetermined switching operation the matching element switches from said first state to said second state.

33. Differential switching circuitry including:
a first switch element connected between a common node of the circuitry and a first output node of the circuitry;
a second switch element connected between the said common node and a second output node of the circuitry;
first and second driver means corresponding respectively to the said first and second switch elements, each having an input for receiving an input signal and an output connected to a control terminal of its corresponding switch element for applying thereto a switching signal so as to switch the element ON or OFF, each driver means being switchable, by application thereto of a disabling signal, from a responsive state in which it is operable to change its said switching signal in response to an input-signal change at its said input, to a non-responsive state in which the said switching signal is not changed in response to such an input-signal change, the said input signals received respectively at the first-driver-means input and the said second-driver-means input being mutually complementary; and cross-coupling means connected for deriving the said disabling signal for each of the first and second driver means from the said input signal of the other driver means such that when the respective input signals undergo complementary changes one of the said driver means is initially in the said responsive state and the other of the said driver means is initially in the said non-responsive state;

wherein each said driver means includes:
first and second supply lines;
a first circuit selectively activatable to pull the potential of the said output towards the first-supply-line potential so as to turn the said corresponding switch element ON, said first circuit including current control means for controlling the rate at which the output potential is pulled towards the first-supply-line potential when the first circuit is activated; and
a second circuit selectively activatable to pull the output potential towards the second-supply-line potential so as to turn the said corresponding switch element OFF.

34. Differential switching circuitry including:
a first switch element connected between a common node of the circuitry and a first output node of the circuitry;
a second switch element connected between the said common node and a second output node of the circuitry;
first and second driver means corresponding respectively to the said first and second switch elements, each having an input for receiving an input signal and an output connected to a control terminal of its corresponding switch element for applying thereto a switching signal so as to switch the element ON or OFF, each driver means being switchable, by application thereto of a disabling signal, from a responsive state in which it is operable to change its said switching signal in response to an input-signal change at its said input, to a non-responsive state in which the said switching signal is not changed in response to such an input-signal change, the said input signals received respectively at the first-driver-means input and the said second-driver-means input being mutually complementary; and cross-coupling means connected for deriving the said disabling signal for each of the first and second driver means from the said input signal of the other driver means such that when the respective input signals undergo complementary changes one of the said driver means is initially in the said responsive state and the other of the said driver means is initially in the said non-responsive state;

wherein each said driver means includes:
first and second supply lines;
a first circuit selectively activatable to pull the potential of the said output towards the first-supply-line potential so as to turn the said corresponding switch element ON; and
a second circuit selectively activatable to pull the output potential towards the second-supply-line potential so as to turn the said corresponding switch element OFF, the said second-supply-line potential being equal to or close to the potential of the said common node.

35. Differential switching circuitry including:
a first switch element connected between a common node of the circuitry and a first output node of the circuitry;
a second switch element connected between the said common node and a second output node of the circuitry;
first and second driver means corresponding respectively to the said first and second switch elements, each having an input for receiving an input signal and an output connected to a control terminal of its corresponding switch element for applying thereto a switching signal so as to switch the element ON or OFF, each driver means being switchable, by application thereto of a disabling signal, from a responsive state in which it is operable to change its said switching signal in response to an input-signal change at its said input, to a non-responsive state in which the said switching signal is not changed in response to such an input-signal change, the said input signals received respectively at the first-driver-means input and the said second-driver-means input being mutually complementary;

cross-coupling means connected for deriving the said disabling signal for each of the first and second driver means from the said input signal of the other driver means such that when the respective input signals undergo complementary changes one of the said driver means is initially in the said responsive state and the other of the said driver means is initially in the said non-responsive state; and respective first and second rate control means for generating the said first and second mutually-complementary input signals respectively, each said rate control means serving to control a slew rate of the input signal it generates.

36. Differential switching circuitry including:
a first switch element connected between a common node of the circuitry and a first output node of the circuitry;
a second switch element connected between the said common node and a second output node of the circuitry;
first and second driver means corresponding respectively to the said first and second switch elements, each having an input for receiving an input signal and an output connected to a control terminal of its corresponding switch element for applying thereto a switching signal so as to switch the element ON or OFF, each driver means being switchable, by application thereto of a disabling signal, from a responsive state in which it is operable to change its said switching signal in response to an input-signal change at its said input, to a non-responsive state in which the said switching signal is not changed in response to such an input-signal change, the said input signals received respectively at the first-driver-means input and the said second-driver-means input being mutually complementary;

cross-coupling means connected for deriving the said disabling signal for each of the first and second driver means from the said input signal of the other driver means such that when the respective input signals undergo complementary changes one of the said driver means is initially in the said responsive state and the other of the said driver means is initially in the said non-responsive state; and compensation means connected to each said switch element for compensating for charge coupled from the initially-non-responsive driver means to its said corresponding switch element when the input signal of that driver means changes.

37. A digital-to-analog converter including:

a first switch element connected between a common node and a first output node;

a second switch element connected between said common node and a second output node;

a current source or current sink connected operatively to said common node for delivering thereto a substantially constant current; and first and second driver means corresponding respectively to said first and second switch elements, each connected to its corresponding switch element for switching that element between respective first and second states in dependence upon an applied input signal, one of the first and second states being an ON state and the other of those two states being an OFF state, the first and second driver means co-operating such that one of the two switch elements has said first state when the other of the two switch element has said second state;

wherein each said switch element is paired with a matching element in the driver means corresponding to the other said switch element, which matching element is coupled operatively to the driver means corresponding to its paired switch element and is matched with its paired switch element such that a predetermined switching operation of the matching element is matched with switching of its paired switch element from said first state to said second state, that predetermined switching operation serving to bring about switching of said other switch element from said second state to said first state.

38. A digital-to-analog converter as claimed in claim 37, wherein a cascading transistor is connected between said current source or current sink and said common node.

39. A digital-to-analog converter comprising a plurality of differential switching circuits, each circuit including:

a first switch element connected between a common node of the circuit and a first output node of the circuit;

a second switch element connected between said common node and a second output node of the circuit;

first and second driver means corresponding respectively to said first and second switch elements, each connected to its corresponding switch element for switching that element between respective first and second states in dependence upon an applied input signal, one of the first and second states being an ON state and the other of those two states being an OFF state, the first and second driver means co-operating such that one of the two switch elements has said first state when the other of the two switch element has said second state;

wherein each said switch element is paired with a matching element in the driver means corresponding to the other said switch element, which matching element is coupled operatively to the driver means corresponding to its paired switch element and is matched with its paired switch element such that a predetermined switching operation of the matching element is matched with switching of its paired switch element from said first state to said second state, that predetermined switching operation serving to bring about switching of said other switch element from said second state to said first state;

the respective first output nodes of the differential switching circuits of said plurality being connected together and the respective second output nodes of the differential switching circuits of said plurality being connected together; and the converter further comprising a plurality of current sources or current sinks, corresponding respectively to the differential switching circuits of said plurality, each current source or current sink being connected operatively to said common node of its said corresponding differential switching circuit for delivering thereto a substantially constant current.

40. A digital-to-analog converter as claimed in claim 39, wherein a cascading transistor is connected between each said current source or current sink and said common node of the corresponding differential switching circuit.

* * * * *